(12) United States Patent
Shoji et al.

(10) Patent No.: US 8,536,463 B2
(45) Date of Patent: Sep. 17, 2013

(54) PRINTED-CIRCUIT BOARD AND MANUFACTURING METHOD THEREOF

(75) Inventors: Mitsuharu Shoji, Tokyo (JP); Kiwamu Adachi, Kanagawa (JP)

(73) Assignee: Sony Corporation, Tokyo (JP)

( * ) Notice: Subject to any disclaimer, the term of this patent is extended or adjusted under 35 U.S.C. 154(b) by 366 days.

(21) Appl. No.: 12/923,997

(22) Filed: Oct. 20, 2010

(65) Prior Publication Data

US 2011/0114376 A1 May 19, 2011

(30) Foreign Application Priority Data

Nov. 13, 2009 (JP) ................................. 2009-259811
Jul. 16, 2010 (JP) ................................. 2010-161864

(51) Int. Cl.
*H05K 3/02* (2006.01)
*H05K 3/10* (2006.01)
*H05K 1/16* (2006.01)

(52) U.S. Cl.
USPC ............................................ 174/260; 29/846

(58) Field of Classification Search
USPC ............ 174/260; 361/761–764; 29/846–853
See application file for complete search history.

(56) References Cited

U.S. PATENT DOCUMENTS

2005/0128720 A1* 6/2005 Croswell et al. .............. 361/763
2006/0002097 A1* 1/2006 Borland et al. ................ 361/763

FOREIGN PATENT DOCUMENTS

| JP | 2716138 A | 11/1997 |
| JP | 2007-013090 A | 1/2007 |
| JP | 2008-078547 | 4/2008 |

* cited by examiner

*Primary Examiner* — Jeremy Norris
(74) *Attorney, Agent, or Firm* — Rader, Fishman & Grauer PLLC

(57) ABSTRACT

A method for manufacturing a printed-circuit board including: a capacitive element forming step of embedding a capacitive element in a substrate resin layer inside a substrate that includes a plurality of wiring layers laminated with the substrate resin layer interposed in between, the capacitive element forming step including forming a lower electrode using a conductive layer on one of the plurality of wiring layers, or using one of the plurality of wiring layers; forming a crystalline metal oxide-containing capacitor dielectric film at a temperature at or below a heat-resistant temperature of the substrate resin layer, and at or above room temperature; and forming an upper electrode on an upper surface of the capacitor dielectric film on the side opposite to the lower electrode.

11 Claims, 11 Drawing Sheets

PRINTED-CIRCUIT BOARD AND MANUFACTURING METHOD THEREOF

BACKGROUND OF THE INVENTION

1. Field of the Invention

The present invention relates to a printed-circuit board that includes a capacitive element embedded in a substrate resin layer inside a substrate that includes a plurality of wiring layers laminated with the substrate resin layer interposed in between, and to a manufacturing method of such printed-circuit boards.

2. Description of the Related Art

Printed-wiring boards and flexible substrates are examples of the substrate (hereinafter, "printed-circuit board") that is incorporated in an electronic device with an electronic circuit that includes the wiring formed by using a technique such as printing. Generally, such printed-circuit boards are formed by mounting simple passive element components such as capacitors and inductors during the formation of the substrate. Because the capacitance and inductance of some of the simple component capacitors and inductors are larger than those of the passive elements formed in a semiconductor integrated circuit (IC), it is not easy to replace the simple passive element components with the capacitive elements in the semiconductor integrated circuit.

For this reason, large numbers of simple passive element components are typically mounted on a printed-circuit board, in addition to a semiconductor integrated circuit. However, the mount area of the printed board needs to be increased as the number of components that cannot be integrated into the semiconductor integrated circuit (IC) is increased. Many of such simple passive components that cannot be provided as an IC have heights that exceed the mount height (the dimension vertical to the mount face) of the semiconductor integrated circuit.

For these reasons, various passive elements mounted on a printed circuit are considered as a large obstacle that prevents miniaturization of electronic devices.

Capacitor, a representative passive element, must satisfy the requirements of both miniaturization and high-frequency. This has led to the development of a technique by which a separately produced simple component is embedded in a substrate. There has also been active research directed to realizing a capacitor integrated in a substrate.

A known example of such a capacitor integrated in a substrate is a thin capacitor of an MIM (Metal-Insulator-Metal) structure in which a lower electrode is formed using the wiring layer of the multilayer wiring structure inside a printed-circuit board, and in which a high-relative permittivity dielectric film and an upper electrode are laminated on the lower electrode (see, for example, JP-A-2008-78547 (Patent Document 1)).

Generally, the base material of the printed-circuit board, specifically, the base material of the substrate composite including a substrate interlayer resin layer made of an organic compound polymer (hereinafter, "substrate resin layer") does not withstand high temperatures. It is therefore important to form the metal electrode films and the dielectric film by low-temperature deposition such as low-temperature sputtering. Further, because the dielectric film deposited by low-temperature deposition generally does not turn into crystals immediately after the deposition (as-deposited state), the film has low relative permittivity (for example, 5 or less). This necessitates a heat treatment for the dielectric film after the deposition to improve relative permittivity. High temperatures of 400° C. and higher are generally used for the heat treatment. It is therefore very difficult, if possible, to use the low heat-resistant polymer as the base material of the substrate composite (printed-circuit board).

As a solution to this problem, amorphous materials, such as BiZnNb amorphous metal oxides, that have high relative permittivity even in low-temperature deposition have been proposed (see, for example, JP-A-2007-13090 (Patent Document 2)).

Facing targets sputtering as a low-temperature and high-speed deposition method is also proposed (see, for example, Japanese Patent No. 2716138 (Patent Document 3)).

SUMMARY OF THE INVENTION

The dielectric film materials described in Patent Document 2 are amorphous materials, and as such many of the materials lack heat stability, and have the possibility of changing their properties by the heat history of an about 200° C. to 300° C. range after the deposition in the manufacture of the printed-circuit board.

Materials that have crystallinity at low temperatures of 100° C. to 300° C., and that can be deposited using a sol-gel method are available. However, such deposition methods often require multiple steps of solution handling and coating, and multiple runs of solvent evaporation. Further, a heat treatment of 400° C. or higher may additionally be required to obtain high relative permittivity.

Accordingly, there is a need for a method for manufacturing a printed-circuit board that includes a thermally stable capacitor dielectric film having high relative permittivity even in the presence of the upper limit of heat imposed by the substrate resin layer. There is also a need for a printed-circuit board that includes a thermally stable capacitor dielectric film having high relative permittivity even when the capacitor is formed by being embedded in a substrate laminate.

According to an embodiment of the invention, there is provided a method for manufacturing a printed-circuit board. The method includes a capacitive element forming step of embedding a capacitive element in a substrate resin layer inside a substrate that includes a plurality of wiring layers laminated with the substrate resin layer interposed in between. The capacitive element forming step includes: forming a lower electrode using a conductive layer on one of the plurality of wiring layers, or using one of the plurality of wiring layers; forming a crystalline metal oxide-containing capacitor dielectric film at a temperature at or below a heat-resistant temperature of the substrate resin layer, and at or above room temperature; and forming an upper electrode on an upper surface of the capacitor dielectric film on the side opposite to the lower electrode.

According to the manufacturing method of the embodiment of the invention, the crystalline metal oxide-containing capacitor dielectric film is formed at a temperature at or below the heat-resistant temperature of the substrate resin layer that generally specifies the upper limit of heating the printed-circuit board. Thus, the capacitor dielectric film can have a large relative permittivity without annealing or substrate heating, or even under low-temperature conditions at or below the heat-resistant temperature of the substrate resin layer. Further, because annealing does not change the film properties, the resulting capacitor dielectric film is thermally stable.

There are cases where the relative permittivity is improved by the heating of the substrate during the deposition of the capacitor dielectric film.

However, the manufacturing method of the embodiment of the invention does not require heating the substrate, because the method allows a sufficiently high relative permittivity to be obtained without heating the substrate.

According to another embodiment of the invention, there is provided a printed-circuit board that includes a capacitive element embedded in a substrate resin layer inside a substrate that includes a plurality of wiring layers laminated with the substrate resin layer interposed in between.

The capacitive element includes: a lower electrode formed using a conductive layer on one of the plurality of wiring layers, or using one of the plurality of wiring layers; and a dielectric film and an upper electrode laminated on the lower electrode, wherein the dielectric film contains crystalline metal oxide.

The embodiments of invention advantageously provides a method for manufacturing a printed-circuit board that includes a thermally stable capacitor dielectric film having high relative permittivity even in the presence of the upper limit of heat imposed by the substrate resin layer. Further, the embodiments of the invention advantageously provides a printed-circuit board that includes a thermally stable capacitor dielectric film having high relative permittivity even when the capacitor is formed by being embedded in a substrate laminate.

DESCRIPTION OF THE PREFERRED EMBODIMENTS

An embodiment of the invention is described below with primary focus on the deposition of a $ZrO_2$ film by facing targets sputtering. Descriptions are given in the following order, with reference to the accompanying drawings.

1. Overview of the Embodiment: General Outline of the Embodiment of the Invention
2. First Example: Example under specific conditions
3. Second Example: Example describing crystal and amorphous criticalities
4. Third Example: Example suited for improving leak characteristics
5. Discussion of the Results of First to Third Examples
6. Fourth Example: Use of a Pt deposition base as opposed to Ni and Cu used in First to Third Examples. Deposition conditions, including gas pressure, are different from those of First to Third Examples
7. Fifth Example: Substrate is heated under the conditions of Fourth Example
8. Discussion of the Results of Fourth and Fifth Examples, and Comparative Example: Effects of substrate heating are discussed using the results from these two Examples. Comparative Example is also described in which a sample from Fourth Example is annealed to demonstrate high heat stability.

1. Overview of the Embodiment

Basic Structure

Figure 1:
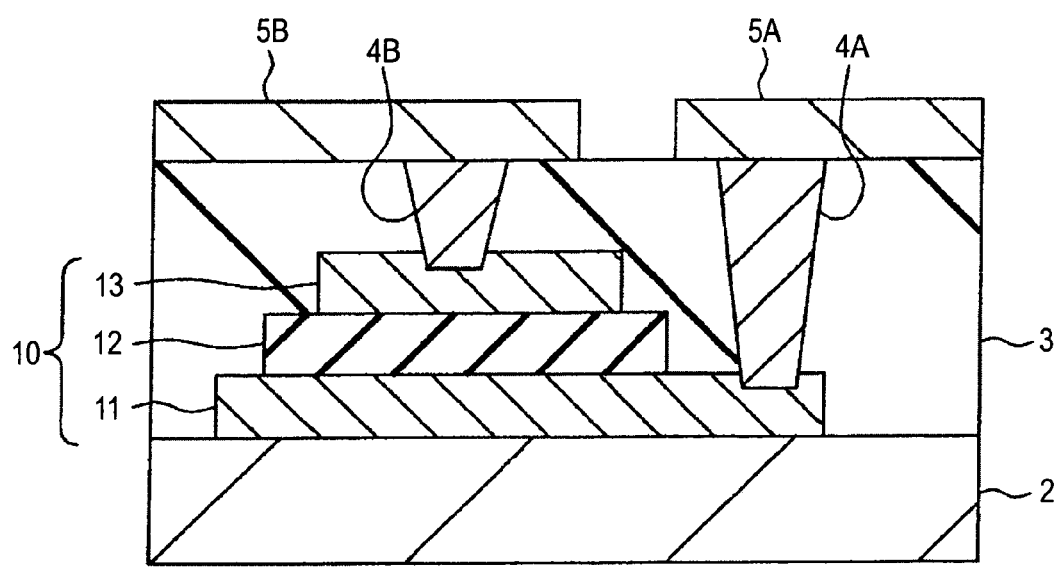
FIG. 1 is a schematic cross sectional view illustrating a basic structure of a thin-film capacitor formed in a printed-circuit board of an embodiment of the invention.

FIG. 1 is a cross sectional view schematically illustrating a basic structure of a thin-film capacitor formed in a printed-circuit board of an embodiment of the invention. The basic structure is common to the First to Fifth Examples, and Comparative Example described below.

A printed-circuit board 1 illustrated in FIG. 1 has a substrate structure that includes a plurality of wiring layers and a substrate resin layer interposed in the laminate of the wiring layers. In its simplest form, the basic substrate structure is a bilayer structure of two wiring layers formed thicknesswise on the front and back surfaces of a single substrate resin layer. This basic structure may be modified to include a multilayer wiring substrate structure that includes three or more wiring layers. In this case, the substrate resin layer is interposed between each pair of wiring layers.

Further, a laminate of a plurality of wiring layers with an interposed substrate resin layer may be provided for each of the front and back surfaces of a core substrate. In this case, the basic structure illustrated in FIG. 1 is provided on at least one of the front and back surfaces of the core substrate, and the thin-film capacitor is embedded in this basic structure.

In short, the structural requirement for the printed-circuit board 1 of the embodiment of the invention is to include a plurality of wiring layers, and to interpose a substrate resin layer between the wiring layers. Any number of layers may be laminated.

In the embodiment of the invention, an MIM capacitor (capacitive element) is embedded in the substrate'resin layer inside the printed-circuit board 1 of the structure described above. The capacitor may be embedded in any substrate resin layer in the laminate.

In FIG. 1, 2 denotes a portion of the printed-circuit board 1 (the printed-circuit board 1 being laminated) that serves as the base of the capacitor during the capacitor formation. The printed-circuit board 1 being laminated will be referred to as a capacitor-forming base substrate 2 for the purpose of explanation. Generally, the capacitor-forming base substrate 2 is a lower substrate resin layer or the core substrate (for example, a strong, thick resin substrate).

The capacitor-embedded portion between the wiring layers is a substrate resin layer 3.

As illustrated in FIG. 1, a lower electrode 11 of an MIM capacitor 10 is formed on the capacitor-forming base substrate 2. The lower electrode 11 may be a portion of the wiring layer formed on the outermost surface of the capacitor-forming base substrate 2, or a portion of conductive material patterns formed by a technique such as printing using the same material used for the wiring layer. Alternatively, the lower electrode 11 may be a conductive layer formed on the wiring layer on the outermost surface of the capacitor-forming base substrate 2.

The lower electrode 11 may be a single-material conductive layer or a single-material wiring layer, or may be a laminate of more than one conductive film.

A capacitor dielectric film 12 and an upper electrode 13 are laminated on the lower electrode 11.

The conductive materials used for the lower electrode 11 and the upper electrode 13 are not limited. Preferably, nickel (Ni), copper (Cu), or platinum (Pt) is used for a part of or all of the lower electrode 11 (thicknesswise), including the uppermost surface in contact with the capacitor dielectric film 12.

Examples of the dielectric material usable for the capacitor dielectric film 12 include metal oxide films of, for example, silicon oxide, silicon nitride, aluminum oxide, hafnium oxide, zirconium oxide, tantalum oxide, strontium titanate, barium titanate, and barium strontium titanate. The metal oxide films need to be crystalline.

The capacitor dielectric film 12 may be formed using only one kind of these dielectric materials, or by laminating or combining thin films of these dielectric materials, or adding an additional element to the dielectric materials.

As the preferred conductive material for the lower electrode 11, nickel (Ni), copper (Cu), or platinum (Pt) is usable only when specific materials, for example, zirconium oxide ($ZrO_2$), are used for the capacitor dielectric film 12. For other dielectric materials, the lower electrode 11 is not limited to the foregoing three materials. For example, the lower electrode 11 may be formed using other conductive materials, for example, such as Ru and Mo.

The capacitor dielectric film 12 is one of the characteristic elements of the invention, and includes a film of crystalline metal oxide. As used herein, the term "crystalline" refers to at least partially having crystallinity including at least one of monoclinic, tetragonal, and cubic states, such as in polycrystals and microcrystals. One of the features of the invention is that the crystalline metal oxide film can be obtained at temperatures at or below the heat-resistant temperature of the substrate resin layer 3, and at or above room temperature, as will be described later in detail.

The room temperature which is the lower formation temperature is from about 0° C. to about 40° C. in the broad sense, and from about 15° C. to about 25° C. in the narrow sense.

The upper-limit temperature of forming the capacitor dielectric film 12 is at or below the heat-resistant temperature of the substrate resin layer 3. This is to prevent the substrate resin layer, when provided in the capacitor-forming base substrate 2, from being thermally damaged during the deposition of the crystalline metal oxide film.

Generally, the maximum temperature for the manufacture of the printed-circuit board 1 is at or below the heat-resistant temperature of the substrate resin layer. For example, the heat of the heat press performed after the formation of the capacitor is set taking into consideration such a maximum temperature. By forming the capacitor dielectric film 12 at or below the heat-resistant temperature of the substrate resin layer, there will be no temperature-induced changes in the metal oxide film composition in the subsequent history, and a stable crystalline dielectric film can be obtained.

Examples of the materials usable for the substrate resin layer 3 include polyimide- or epoxy-containing polymer resin materials.

The invention has been made based on the finding that a thermally stable crystalline metal oxide film can be formed at relatively low temperatures without substrate heating or high-temperature annealing that typically involves temperatures at or above 400° C. or 450° C. Details of this technique will be described later based on specific examples.

The heat-resistant temperature of the substrate resin layer 3 (the applicable upper-limit temperature) is not limited, and may be, for example, 200° C. or less, and 150° C. or more. Developing a substrate resin layer 3 with higher heat-resistant temperatures increases the heat-resistant temperature usable in the invention. Thus, the heat-resistant temperature is not limited to the examples given above. For example, in the invention, the crystalline metal oxide film for the capacitor dielectric film 12 may be deposited at temperatures above 200° C. Deposition temperatures less than 150° C. are also possible, provided that it is not below room temperature.

The plane patterns, or the shapes that specify the relative areas of the lower electrode 11, the capacitor dielectric film 12, and the upper electrode 13 illustrated in FIG. 1 are not particularly limited. In the example of FIG. 1, the plane size (area) increases towards to the lower layers. However, any size can be used as long as the area of the effective capacitor portion (MIM structure portion) of the lower electrode 11 and the upper electrode 13 on the opposite sides of the capacitor dielectric film 12 are sized to produce a necessary capacitance value according to the material, relative permittivity, and thickness of the capacitor dielectric film 12. In this example, the plane size (area) of the lower electrode 11 is one size larger than the upper electrode 13, because the electrodes are extracted from the upper surface. Note that the lower electrode may be extracted from the back surface side, specifically, from the side of the capacitor-forming base substrate 2. In this case, the lower electrode 11 is not necessarily required to have a larger area than the upper electrode 13.

In FIG. 1, an aperture is formed in the substrate resin layer 3 using a laser or other processes, and a conductive material is embedded therein to form a via 4A.

In the same fashion, an aperture is formed in the substrate resin layer portion on the upper surface side of the upper electrode 13 using a laser or other processes, and a conductive material is embedded therein to form a via 4B.

Wiring layers 5A and 5B in contact with the vias 4A and 4B, respectively, are formed on the upper surface of the substrate resin layer 3.

Clearly, it is understood from the foregoing explanation that the wiring layers 5A and 5B can serve as the lower electrodes when a similar capacitor structure is further laminated.

[Manufacturing Method]

Figure 2:
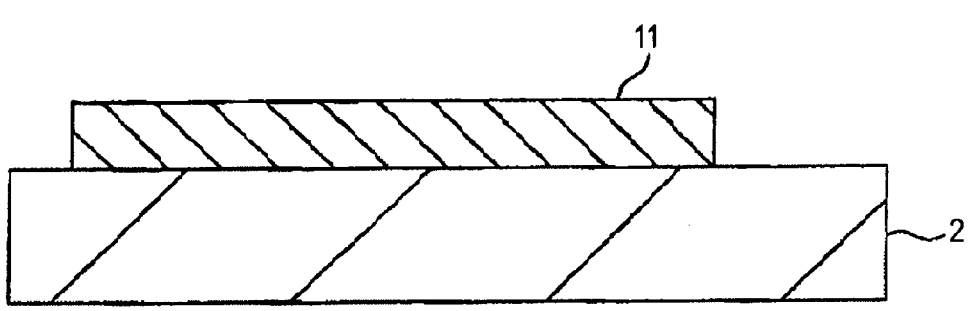
FIG. 2 is a schematic cross sectional view illustrating the basic structure of FIG. 1 during manufacture.
Figure 3:
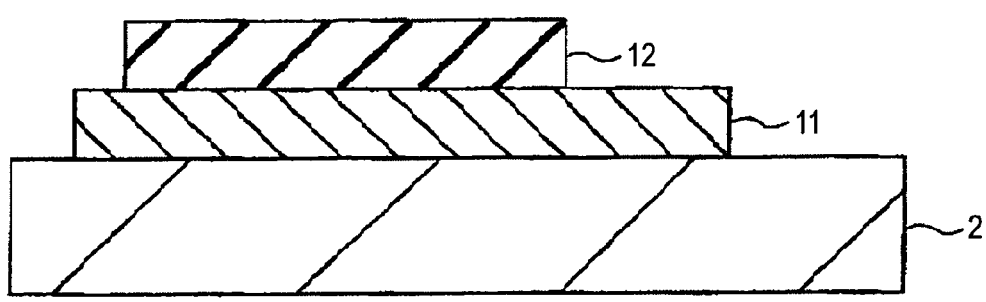
FIG. 3 is a schematic cross sectional view after the deposition of a dielectric film in the basic structure of FIG. 2.

FIG. 2 and FIG. 3 are cross sectional views schematically illustrating structures being processed to fabricate the structure of FIG. 1.

As illustrated in FIG. 2, the lower electrode 11 is formed after the capacitor-forming base substrate 2 is formed using a known method. The lower electrode 11 is formed using a circuit printing method, partial deposition of a conductive layer, or pattern formation by wet or dry etching after the deposition of a conductive layer. For the partial deposition technique, a metal mask method can be used in which a metal mask having an aperture pattern that corresponds to the target portion is disposed in contact with or in proximity to the deposition target surface, and conductive material is partially deposited through the metal mask using a physical deposition method such as vapor deposition and sputtering.

Because the capacitor dielectric film 12 is not present at the time of forming the lower electrode 11, the lower electrode 11 may be formed using techniques other than the physical deposition method. For example, a chemical deposition technique such as an ALD method can be used.

As illustrated in FIG. 3, the capacitor dielectric film 12 is formed on the lower electrode 11. The preferred technique for forming the capacitor dielectric film 12 is the physical deposition of high-energy conductive particles, for example, by sputtering.

Preferably, for example, a facing targets, ECR, or ion beam (EB) sputtering apparatus is used for the sputtering of the high-energy particles.

The ECR and EB sputtering apparatuses become large scale when the film is to be uniformly formed over a deposition target of a large plane area. The facing targets sputtering apparatus is more suited for this purpose, because it efficiently allows the uniform deposition of the film over a deposition target of a large plane area. In this regard, the facing targets sputtering apparatus is suitable as a mass-production apparatus for the deposition of the capacitor dielectric film of the printed-circuit board 1. Note, however, that the ECR and EB sputtering apparatuses are also usable when the capacitor dielectric film is to be deposited over a limited area of the printed-circuit board 1, or when mass production is not of great importance.

As described above, the deposition temperature of the capacitor dielectric film 12 illustrated in FIG. 3 is at or below the heat-resistant temperature of the substrate resin layer, and at or above room temperature. The crystalline metal oxide film, obtainable in this temperature range, is used as the capacitor dielectric film 12.

Specific deposition conditions for forming the crystalline metal oxide film at such relatively low temperatures using the facing targets sputtering apparatus will be described later in Examples.

Thereafter, as illustrated in FIG. 1, the upper electrode 13 is formed on the capacitor dielectric film 12. The upper electrode 13 is formed using a circuit printing method, partial deposition of a conductive layer, or pattern formation by wet or dry etching after the deposition of a conductive layer. The partial deposition may be performed using the metal mask method described above. Electrolytic or nonelectrolytic plating also may be used to form the upper electrode 13.

The substrate resin layer 3 is then attached over the thin-film capacitor 10 formed as above-described, for example, by transferring it from a sheet, and the vias 4A and 4B are formed using a laser or other processes. Conductive layer patterns that become the wiring layers 5A and 5B are formed on the substrate resin layer 3 using a printing technique or etching.

This is followed by heating press. The heating press involves heating temperatures no greater than the heat-resistant temperature so that the substrate resin layer 3 (and other substrate resin layers) is not damaged. The heating causes the substrate resin layer 3 to flow, and the substrate resin surrounds the capacitor 10 without leaving substantially any gap, completely embedding the capacitor 10 in the substrate resin layer.

In this embodiment, the crystalline metal oxide film is formed to provide the capacitor dielectric film 12 at the deposition temperature at or above room temperature and at or below the heat-resistant temperature of the lower substrate resin layer corresponding to the substrate resin layer 3. Thus, the heating to increase the relative permittivity of the capacitor dielectric film is not necessary. In this way, the thermally stable thin-film capacitor with high relative permittivity can be formed by being embedded in the printed-circuit board 1.

Because the high-relative permittivity crystalline metal oxide film is obtained immediately after the deposition of the capacitor dielectric film 12, the additional step of crystallizing the capacitor dielectric film 12 is not necessary, and there accordingly will be no increase in manufacturing cost as a result of using the invention.

Because the thin-film capacitor is formed within the printed-circuit board 1, the mount area (planar area of the printed-circuit board 1) will not be increased. The mount area may even be reduced, and the printed-circuit board 1 that includes the high-capacitance (thin-film) capacitor 10 still can be realized.

The following describes specific Examples of thin-film capacitor formation, particularly deposition conditions of the capacitor dielectric film. FIG. 1 to FIG. 3 are appropriately referred to in the descriptions below. The film thicknesses presented below are merely examples.

2. First Example

A Ni layer (thickness of 100 nm) was formed on the capacitor-forming base substrate 2 of the printed-circuit board 1 to provide the lower electrode 11 or a conductive layer on the lower electrode 11, using a method such as sputtering (see FIG. 2). In the following, the lower electrode or the conductive layer as the deposition base of the capacitor dielectric film will be called a base conductive layer.

The plane pattern of the Ni layer (base conductive layer) was specified using a metal mask method. Specifically, a metal mask having an aperture for the predetermined Ni layer was disposed in contact with or in proximity to the deposition target surface before Ni sputtering.

Then, a 100-nm $ZrO_2$ film as the capacitor dielectric film 12 was formed through a metal mask, using a facing targets sputtering apparatus (see FIG. 3). The plane pattern of the $ZrO_2$ film was specified by a metal mask that had an aperture different from that used for the Ni layer formation. The metal mask having an aperture for the predetermined $ZrO_2$ film was disposed in contact with or in proximity to the deposition target surface before $ZrO_2$ sputtering.

Figure 4:
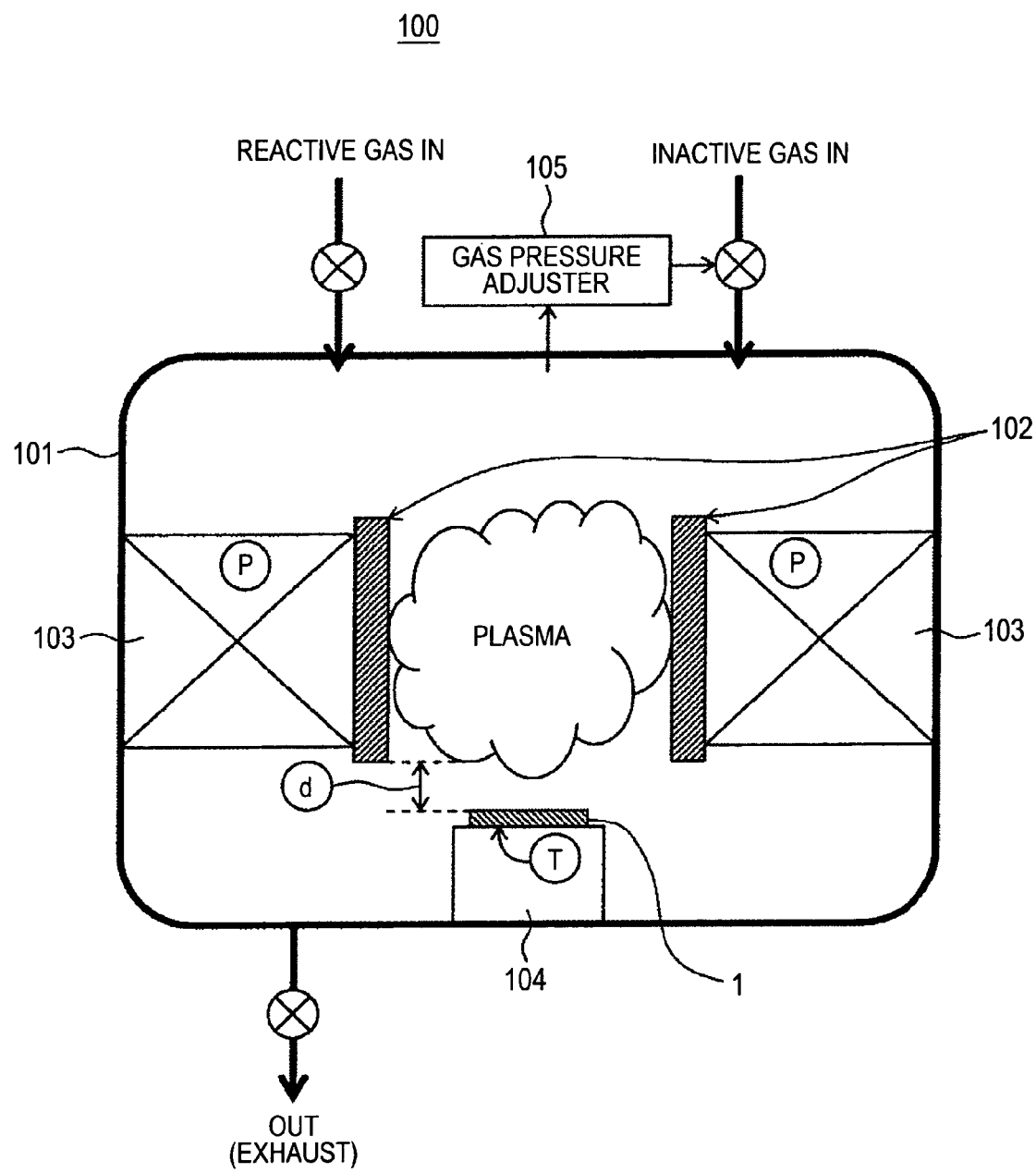
FIG. 4 is a diagram schematically illustrating a facing targets sputtering apparatus usable in the embodiment of the invention.

FIG. 4 is a schematic diagram of the facing targets sputtering apparatus.

A facing targets sputtering apparatus 100 includes a pair of facing targets 102 disposed in a chamber 101. A power applying section 103 of an electrode structure that applies a magnetic field substantially vertically to each target 102 is also provided. A power supply section (not illustrated) supplies power to the power applying sections 103.

The printed-circuit board 1 of the basic structure illustrated in FIG. 1 is held by a susceptor 104 at an adjustable distance d from the pair of targets 102. The susceptor 104 is disposed at an adjustable distance d, and includes a heater with which the temperature of the printed-circuit board 1 (substrate temperature T) can be adjusted in heating the substrate.

The chamber 101 includes inlets for the introduced reactive gas and inactive gas, and an outlet. The exhaust pressure of a pump (not illustrated in FIG. 4) is adjustable with an exhaust valve. The flow rates of the supplied reactive gas and inert gas through conduits are adjustable with adjusting valves.

A gas pressure adjuster 105 is provided for the chamber 101. The gas pressure adjuster 105 adjusts gas pressure by varying the flow rate of primarily the inactive gas (and the exhaust pressure), based on monitored values of the chamber internal pressure.

In the facing targets sputtering apparatus of the structure illustrated in FIG. 4 (for example configured as above), the sputtered particles jumped out of the targets under the high-energy of plasma are deposited upon reaching the substrate (printed-circuit board 1).

The facing targets sputtering apparatus enables uniform sputtering over a relatively wide area of the sputtered target surface.

The plasma generating space is small because it is essentially confined to the space between the facing targets, and because the substrate does not need to be held in this space. It is therefore possible to reduce the size of the apparatus itself that includes the structure providing necessary energy.

Because of the relatively large area, the targets are not easily heated, an efficient cooling structure can be adopted to enable uniform sputtering and thus uniform deposition. Further, because the substrate (printed-circuit board 1) is not exposed to plasma, the substrate is not easily heated by the sputtered particles. This also improves deposition uniformity.

In the facing targets sputtering system, the crystalline metal oxide of the capacitor dielectric film is formed by the high-energy sputtered metal oxide particles that jump out of the plasma and reach the printed-circuit board 1. Here, it is preferable that the high-energy sputtered particles that jump out of the plasma and reach the printed-circuit board 1 be given heat energy that makes the temperature of the printed-circuit board 1 at or below the heat-resistant temperature.

In First Example, the deposition of the $ZrO_2$ film to obtain the crystalline metal oxide film was performed under the following conditions.

Figure 5:
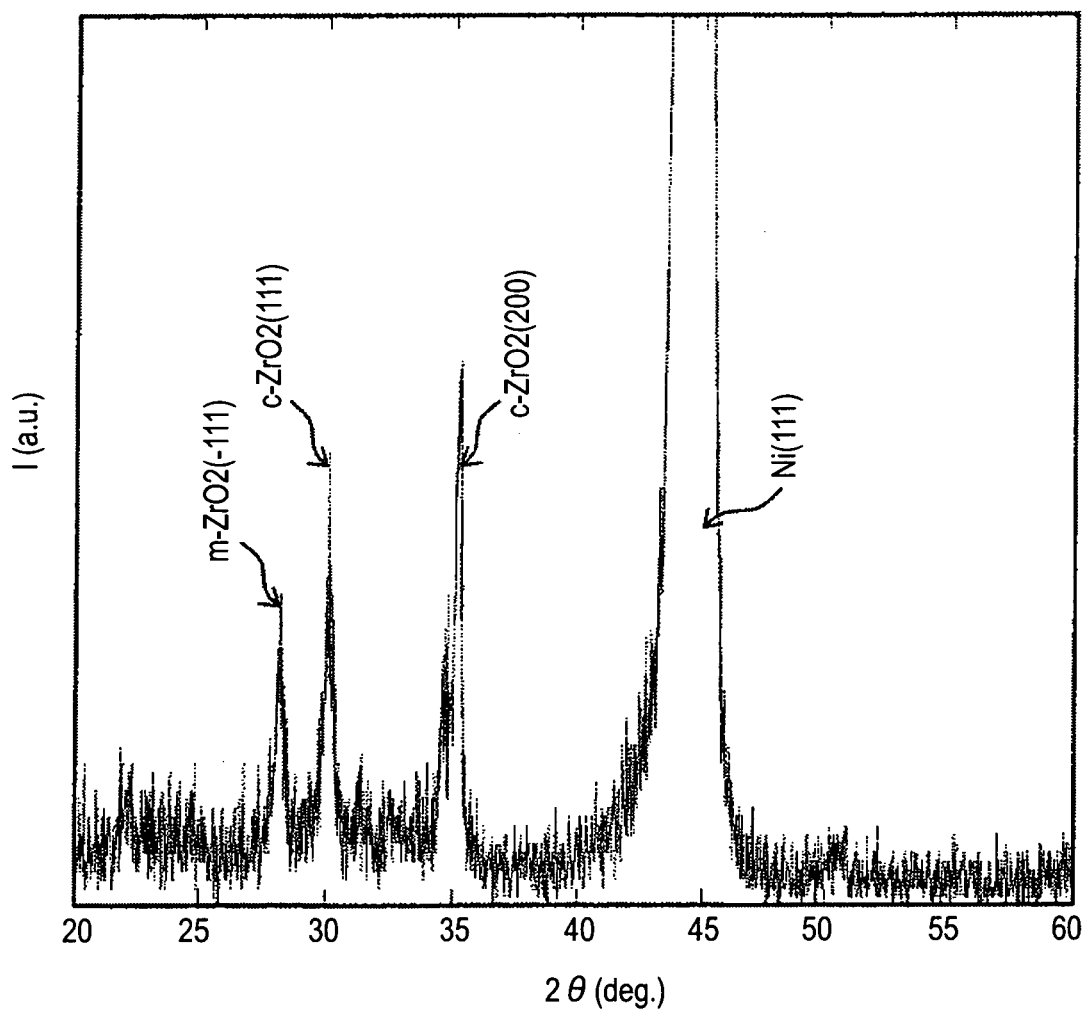
FIG. 5 is a graph representing the result of XRD structure analysis according to First Example.

Target: Zr
Supplied Power Pw: 2,500 W
Sputtering gas: Ar and $O_2$
Gas pressure Pg: 0.3 Pa
Percentage partial pressure of $O_2$: 30%
Target-substrate distance d: 200 mm
Substrate temperature T: room temperature FIG. 5 presents the result of the X-ray diffraction (XRD) structure analysis of the deposited $ZrO_2$ film. In FIG. 5, the horizontal axis denotes the X-ray reflection angle of XRD in a twofold scale (2θ), and the vertical axis denotes XRD relative intensity in arbitrary unit. The XRD relative intensity represents the characteristic values of atomic arrangements with respect to 2θ.

As can be seen in FIG. 5, a monoclinic crystal (monoclinic) peak (m-$ZrO_2$ in FIG. 5 and in the other structure analysis diagrams) was detected in the $ZrO_2$ film (capacitor dielectric film 12) obtained under the foregoing sputtering conditions. A cubic crystal (cubic) peak (c-$ZrO_2$ in FIG. 5 and in the other structure analysis diagrams) was also detected. It can be seen from the detected monoclinic crystal and cubic crystal peaks that the capacitor dielectric film 12 obtained under the foregoing sputtering conditions has a crystalline structure.

Figure 6:
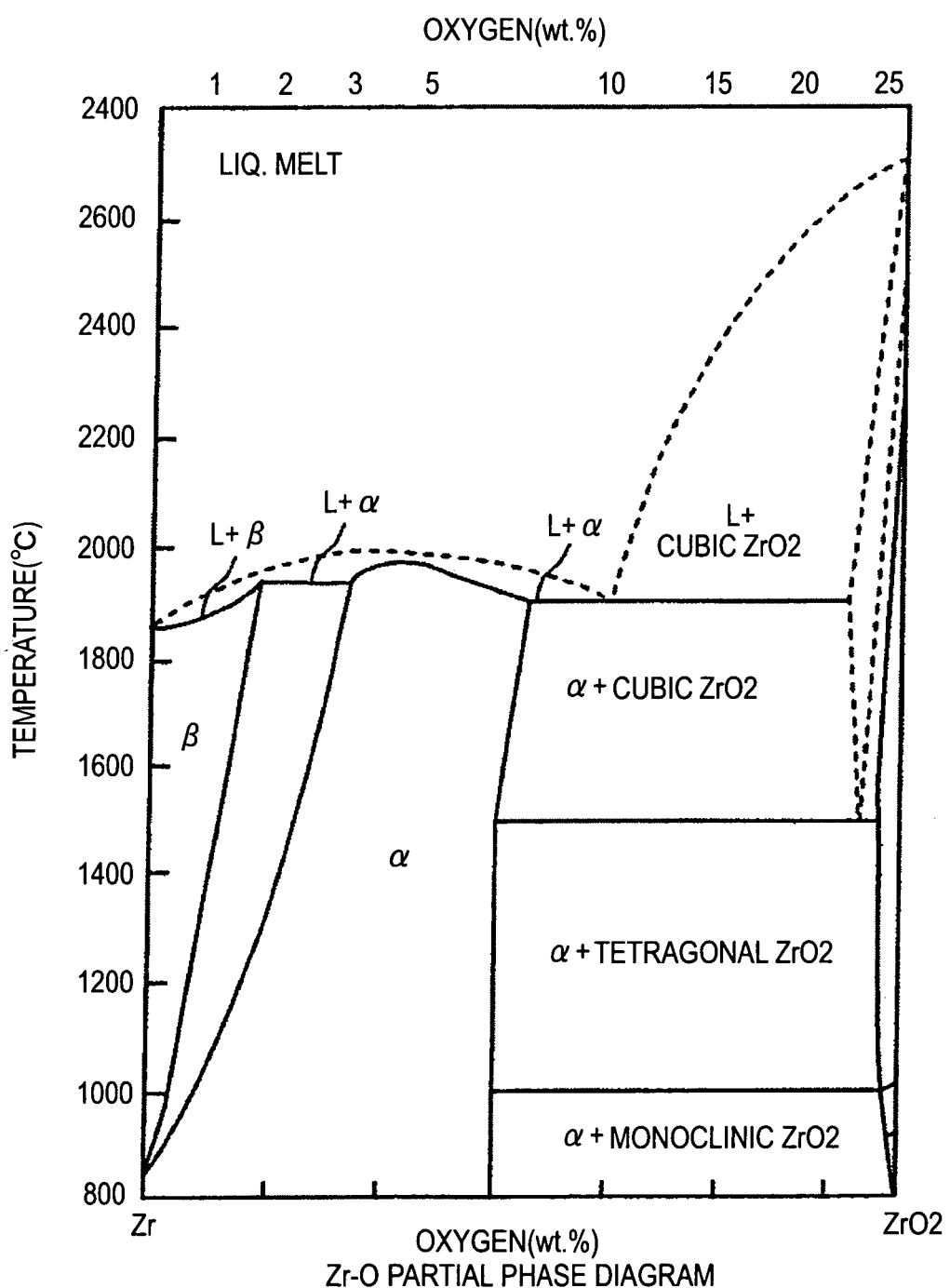
FIG. 6 is a typical $ZrO_2$ phase diagram.

FIG. 6 presents a typical $ZrO_2$ phase diagram (horizontal axis: oxygen content, vertical axis: temperature).

In the common $ZrO_2$ phase diagram (FIG. 6), the cubic crystal occurs only at high temperatures. In contrast, under the conditions of the deposition method of the present embodiment, as presented in FIG. 5, the cubic crystal is obtained despite the deposition at ordinary temperature (synonymous with room temperature in this specification) that involves no substrate heating. This suggests that the crystalline metal oxide thin film is formed by the high-energy sputtered particles in the facing targets sputtering apparatus.

Figure 7:
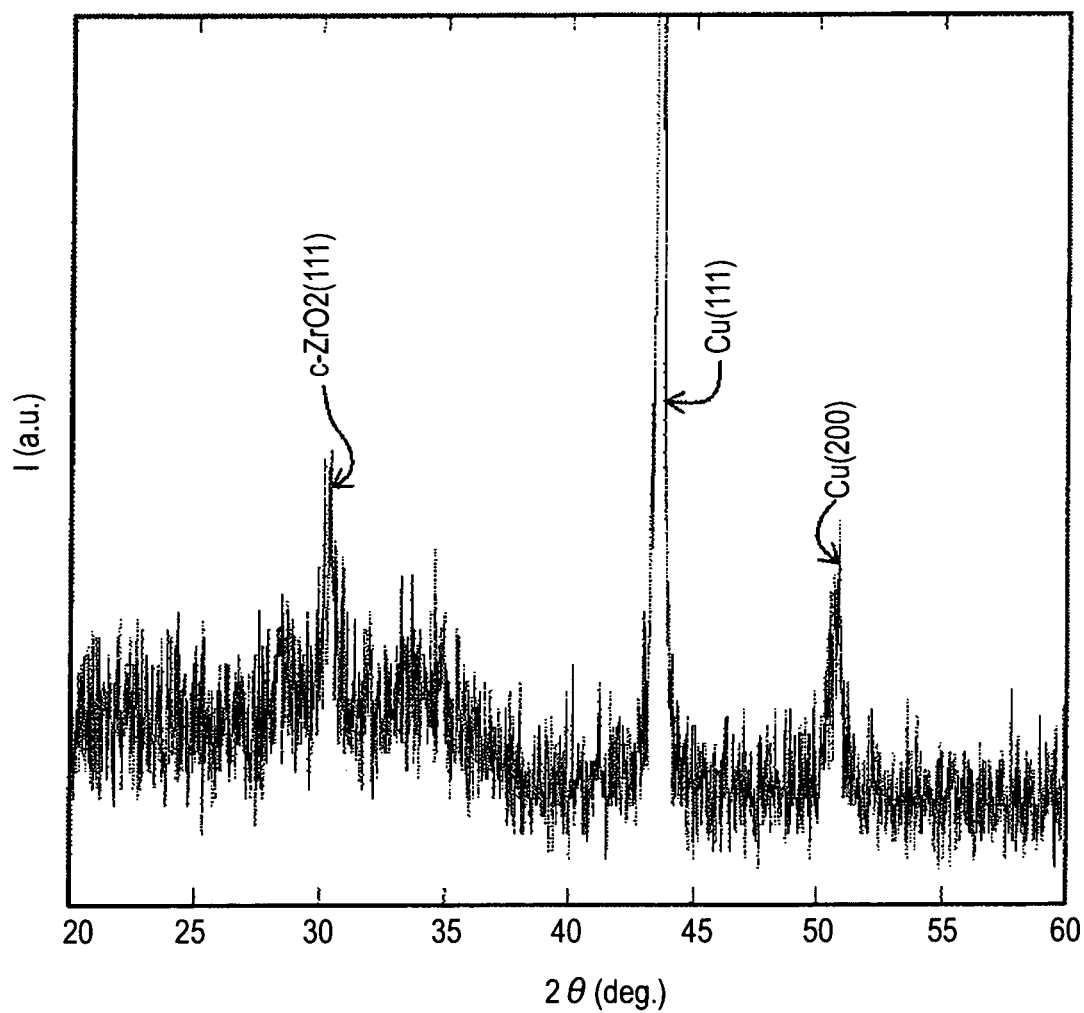
FIG. 7 is a graph representing the result of XRD structure analysis according to First Example using Cu for the underlying metal instead of Ni.

FIG. 7 presents the results of XRD structure analysis after the sputter deposition performed in a similar fashion using a 150-nm thick Cu base conductive layer (lower electrode 11, or a conductive layer on the lower electrode 11).

A crystalline structure was also observed as in the 100-nm thick Ni; however, a monoclinic crystal peak (m-$ZrO_2$) was hardly detected, and only a cubic crystal peak (c-$ZrO_2$) was detected in the crystal structure.

Generally, in $ZrO_2$, the cubic crystal has relatively high permittivity. In the present embodiment, $ZrO_2$ has a relative permittivity of about 30, and only the monoclinic crystal structure has relative permittivities higher than 22 to 25. The substrate temperature measured with a thermo label under the foregoing deposition conditions was 100° C. or less, showing that there was almost no temperature increase in the substrate.

3. Second Example

As in First Example, a base conductive layer was formed on the capacitor-forming base substrate 2 of the printed-circuit board 1 (see FIG. 1) using a metal mask and a method such as sputtering. In Second Example, a Ni layer having a thickness of 100 nm was formed on the lower electrode 11 to provide the base conductive layer. A 100-nm $ZrO_2$ film was then formed in the restricted deposition region specified by a metal mask, using the facing targets sputtering apparatus. The crystalline metal oxide was obtained under the following conditions.

Target: Zr
Supplied power Pw: 2,000 W
Sputtering gas: Ar and $O_2$
Gas pressure Pg: 0.3 Pa
Percentage partial pressure of $O_2$: 30%
Target-substrate distance d: 200 mm
Substrate temperature T: room temperature FIG. 8 presents the result of XRD structure analysis.

In the facing targets sputtering performed under the foregoing conditions, a monoclinic crystal peak (m-$ZrO_2$) was detected, and thus the film was of a crystalline structure. However, a cubic crystal peak (c-$ZrO_2$) was not detected. The relative permittivity was about 22 to 25, a value lower than that obtained when a cubic crystal was detected.

Figure 8:
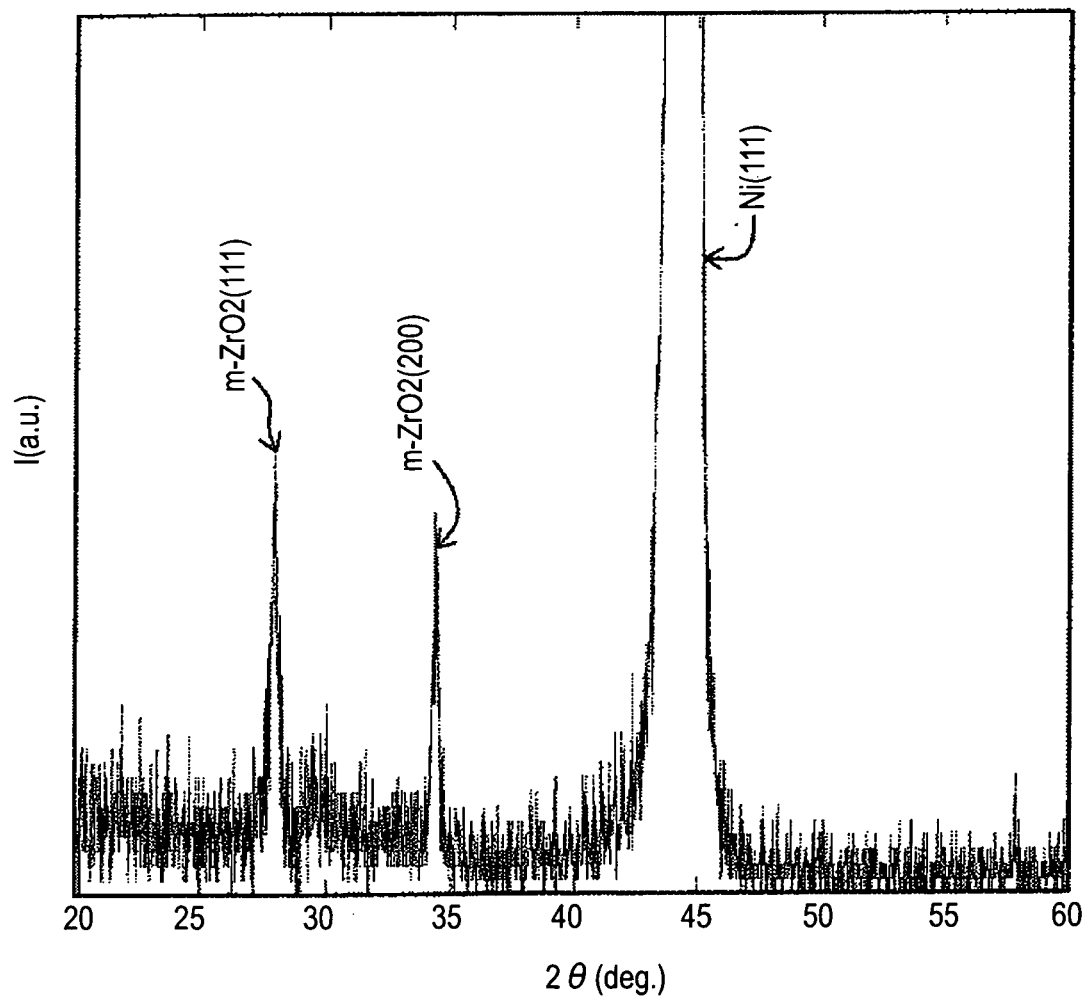
FIG. 8 is a graph representing the result of XRD structure analysis according to Second Example.

The result obtained from the capacitor dielectric film 12 formed on a 150 nm-thick Cu base conductive layer was the same as that presented in FIG. 8 in that a monoclinic crystal peak (m-$ZrO_2$) was detected but a cubic crystal peak (c-$ZrO_2$) was absent.

The substrate temperature measured using a thermo label under the deposition conditions of this example was 100° C. or less as in First Example, showing that there was almost no temperature increase in the substrate.

Supplied power is lower in Second Example than in First Example.

Supplied power was further reduced, as follows.

The material and thickness of the capacitor dielectric film 12 are the same as those in First and Second Examples.

Specifically, as in First Example, a 100 nm-thick Ni layer was formed on the lower electrode 11 to provide a base conductive layer on the capacitor-forming base substrate 2 of the printed-circuit board 1 (see FIG. 1), using a metal mask and a method such as sputtering. A 100-nm $ZrO_2$ film was then formed in the restricted deposition region specified by a metal mask, using the facing targets sputtering apparatus. Sputtering was performed under the following conditions.

Figure 9:
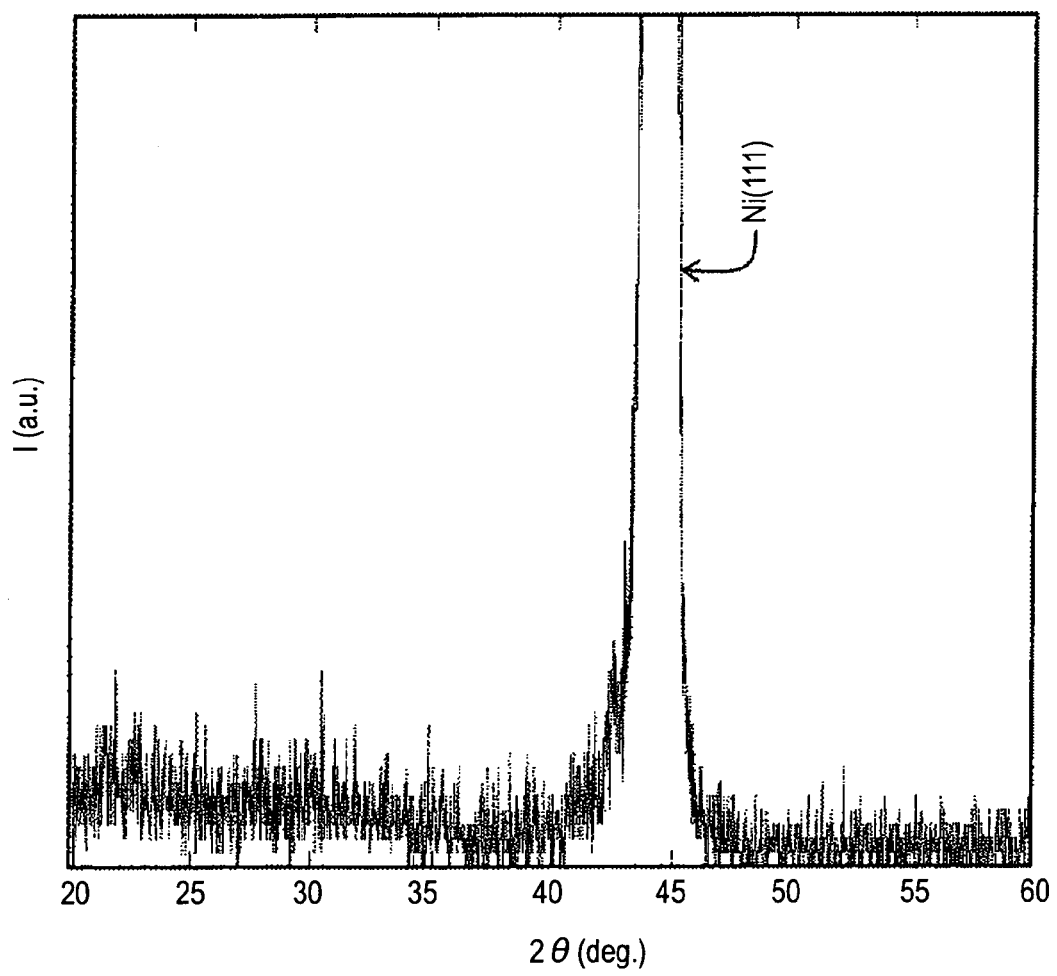
FIG. 9 is a graph representing the result of XRD structure analysis according to Second Example under different conditions.

Target: Zr
Supplied power Pw: 1,500 W
Sputter gas: Ar and $O_2$
Gas pressure Pg: 0.3 Pa
Percentage partial pressure of $O_2$: 30%
Target-substrate distance d: 200 mm
Substrate temperature T: room temperature FIG. 9 presents the result of XRD structure analysis.

At the supplied power as low as 1,500 W, only a Ni peak was detected, and no $ZrO_2$ peaks were observed. From these results, the capacitor dielectric film 12 fabricated under these conditions was determined as being amorphous. Measurements performed under the same conditions using a 150 nm-thick Cu base conductive layer yielded the same result: Only a Ni peak was detected.

The relative permittivity of the capacitor dielectric film 12 was 20 or less, a value lower than that obtained in First Example, and about the same as that obtained from the capacitor dielectric film 12 deposited by standard DC magnetron sputtering.

The substrate temperature measured using a thermo label under the same deposition conditions was 100° C. or less as in First and Second Examples, showing that there was almost no temperature increase in the substrate. Note that the $ZrO_2$ film deposited using standard DC magnetron sputtering had almost the same peak profile.

4. Third Example

As in First and Second Examples, a 100 nm-thick Ni layer was formed on the lower electrode 11 to provide a base conductive layer on the capacitor-forming base substrate 2 of the printed-circuit board 1 (see FIG. 1), using a metal mask and a method such as sputtering.

A 10-nm $ZrO_2$ film was then formed in the restricted deposition region specified by a metal mask, using the facing targets sputtering apparatus. Then, facing targets sputtering was performed under the same deposition conditions that yielded the result presented in FIG. 9 (amorphous metal oxide), specifically, at the supplied power of 1,500 W.

Continuously, an 80-nm $ZrO_2$ film was formed in the same apparatus in the restricted region specified by a metal mask. Then, facing targets sputtering was performed under the same deposition conditions that yielded the result presented in FIG. 5 (crystalline metal oxide including both cubic crystal and monoclinic crystal), specifically, at the increased supplied power of 2,500 W.

Continuously, a 10-nm $ZrO_2$ film was formed in the same apparatus in the restricted region specified by a metal mask again. Then, facing targets sputtering was performed under the same deposition conditions that yielded the result presented in FIG. 9 (amorphous metal oxide), specifically, at the reduced supplied power of 1,500 W.

In the continuous three runs of sputtering, all the other conditions excluding the supplied power, specifically the type of target material, the type of sputtering gas, gas pressure Pg, percentage partial pressure of $O_2$, target-substrate distance d, and substrate temperature T were the same as those used in First and Second Examples.

In this manner, the capacitor dielectric film 12 of the three-layer structure was formed that included the $ZrO_2$ films of the same compositions—the first layer in contact with the lower electrode 11, the second layer formed on the first layer, and the third layer formed on the second layer.

The measured relative permittivity of the capacitor dielectric film 12 ($ZrO_2$ film) of the three-layer structure was about 30, about the same as that obtained in First Example. Leak current density at 1 V was 1E-9 ($A/cm^2$), a value desirably smaller by several orders of magnitude than the leak current density 1E-6 ($A/cm^2$) of the single-layer crystalline metal oxide dielectric film formed in First Example.

5. Discussion of the Results of First to Third Examples

The foregoing Examples found the conditions under which the dielectric film of a crystalline structure that develops crystallinity with high relative permittivity can be obtained using facing targets sputtering. Specifically, it was found that the dielectric film with such desirable properties can be obtained by appropriately setting the supplied power or by appropriately selecting the material of the lower electrode along with other conditions including gas pressure Pg and the partial pressure of $O_2$.

The values of supplied power 2,500 W, 2,000 W, and 1,500 W used in the foregoing Examples depend on various conditions, including the types of method and apparatus used. However, one of the solutions to obtain a crystalline structure in the as-deposited state was found "to be the deposition at the supplied power higher than the supplied power range in which the as-deposited film (during or immediately after the deposition) becomes amorphous". This control of the supplied power is generally also effective for other sputtering methods, sputtering materials, and sputtering conditions, provided that the substrate is disposed outside of the plasma that promotes substrate heating.

The invention applicable to obtain a crystalline structure in the as-deposited state can further improve the properties of the capacitor dielectric film. For example, the film may be subsequently subjected to slight annealing, or slight heating during the deposition, in order to improve relative permittivity or other properties.

Specifically, the capacitor dielectric film forming step may include low-temperature annealing performed at temperatures at or below the heat-resistant temperature of the substrate resin layer 3, and at or above room temperature. Alternatively, the substrate may be heated at low temperatures at or below the heat-resistant temperature of the substrate resin layer 3, and at or above room temperature during the formation of the capacitor dielectric film.

In First to Third Examples, annealing and substrate heating are not performed. However, low-temperature annealing and substrate heating at or below the heat-resistant temperature of the substrate resin layer 3 may be performed when it is expected to improve relative permittivity and leak characteristics, instead of high-temperature substrate heating and annealing that further promotes crystallization.

In <1. Overview of the Embodiment>, the heat-resistant temperature of the substrate resin layer was described as being, for example, 200° C. or less, and 150° C. or more. However, the invention also encompasses wider annealing and substrate heating temperature ranges that may arise from improvement (increase) of heat-resistant temperature.

Relative permittivity values in the as-deposited state are described in Journal of Applied Physics, 104103 (2006), and in Applied Physics Letters 92, 012908 (2008). According to these publications, the relative permittivity of $ZrO_2$ differs depending on crystal structure, and is 25.9, 55.8, and 44.4 for the monoclinic crystal, tetragonal crystal, and cubic crystal, respectively.

In this context, the relative permittivity of 30 presented in First Example falls between the cubic crystal and monoclinic crystal, and the relative permittivities of 22 to 25 presented in Second Example almost coincide with the relative permittivity of the monoclinic crystal. As can be seen from this, there is a good match between the relative permittivity and the results of the XRD crystal structure analyses of the foregoing examples.

For example, $ZrO_2$ undergoes temperature-dependent structural changes from monoclinic crystal→tetragonal crystal→cubic crystal. Tetragonal crystal, which was not detected in the foregoing examples, may be detected depending on conditions.

It was also found from First and Second Examples that the crystalline dielectric film can be obtained at ordinary temperature, regardless of whether the sputtering base is. Ni or Cu.

Larger relative permittivities can be obtained when the sputtering base is Ni than when Cu. The effectiveness of the facing targets system for sputtering was also demonstrated.

It was also found that increasing the supplied power does not lead to a large increase in substrate temperature. This is the advantage of the system in which the substrate is installed outside of the plasma as in the facing targets system. In this way, the supplied power can be increased over a considerably wider range.

The capacitor dielectric film 12 of the three-layer structure including the crystalline metal oxide film between the upper and lower amorphous metal oxide films as in Third Example was found to be effective in reducing leak current.

Examples below describe the result obtained by using Pt for the base conductive layer, and the effect of heating the substrate. The heat stability of the dielectric film deposited by the technique of the invention is also demonstrated.

6. Fourth Example

As in the foregoing First Example and other Examples, a base conductive layer was formed on the capacitor-forming base substrate 2 of the printed-circuit board 1 (see FIG. 1) using a metal film and a method such as sputtering. In this Example, Ni or Pt was formed on the lower electrode 11 in a thickness of 100 nm. Thus, the base conductive layer was either a Ni layer or a Pt layer.

A 10-nm $ZrO_2$ film was then formed in the restricted deposition region specified by a metal mask, using the facing targets sputtering apparatus. Then, facing targets sputtering was performed under the same deposition conditions of First Example that yielded the result presented in FIG. 5 (amorphous metal oxide), specifically, at the supplied power of 2,500 W.

In Fourth Example, the deposition of the $ZrO_2$ film to obtain the crystalline metal oxide film was performed under the following conditions.

Target: Zr
Supplied power Pw: 2,500 W
Sputter gas: Ar and $O_2$
Gas pressure Pg: 0.5 Pa
Percentage partial pressure of $O_2$: 30%
Target-substrate distance d: 190 mm
Substrate temperature T: Room temperature The differences from the deposition conditions of First Example are the gas pressure Pg of 0.5 Pa increased from 0.3 Pa, and the slightly smaller target-substrate distance d of 190 mm. All the other deposition conditions of Fourth Example are the same as those of First Example.

Figure 10:
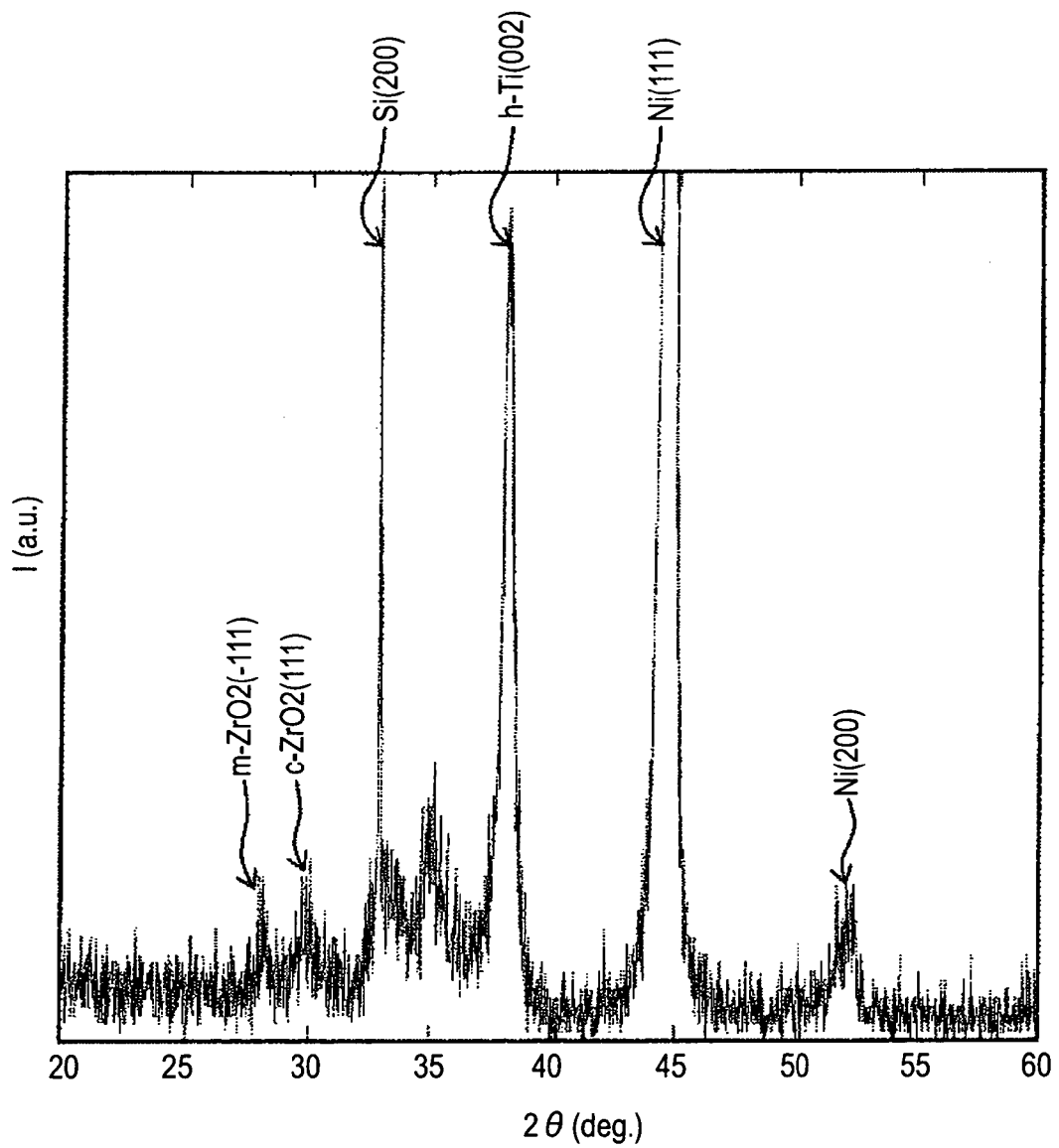
FIG. 10 is a graph representing the result of XRD structure analysis according to Fourth Example.

FIG. 10 presents the result of XRD structure analysis for the Ni base conductive layer.

In the facing targets sputtering performed under the foregoing conditions, a monoclinic crystal peak (m-$ZrO_2$) and a cubic crystal peak (c-$ZrO_2$) were detected. It can be seen from this that the capacitor dielectric film 12 obtained under the foregoing sputtering conditions has a crystalline structure. Substantially the same structure analysis result was obtained for the Pt base conductive layer, detecting a monoclinic crystal peak (m-$ZrO_2$) and a cubic crystal peak (c-$ZrO_2$).

In this Example, the $ZrO_2$ had a relative permittivity of about 27 both for Ni and Pt, and the relative permittivity value was higher than 22 to 25 only in the monoclinic crystal structure. The substrate temperature measured using a thermo label under the foregoing deposition conditions was 100° C. or less for the Ni and Pt base conductive layers, showing that there was almost no temperature increase in the substrate.

7. Fifth Example

As in First Example, a 100-nm Ni layer was formed on the lower electrode to provide a base conductive layer on the capacitor-forming base substrate 2 of the printed-circuit board 1 (see FIG. 1) using a metal mask and a method such as sputtering. A 100-nm $ZrO_2$ film was then formed in the restricted deposition region specified by a metal mask, using the facing targets sputtering apparatus. The crystalline metal oxide was obtained under the following conditions. The difference from the deposition conditions of Fourth Example is that the substrate was heated at a substrate temperature T of 100° C., instead of room temperature.

Target: Zr
Supplied power Pw: 2,500 W
Sputter gas: Ar and $O_2$
Gas Pressure Pg: 0.5 Pa
Percentage partial pressure of $O_2$: 30%
Target-substrate distance d: 190 mm
Substrate temperature T: 100° C.

Figure 11:
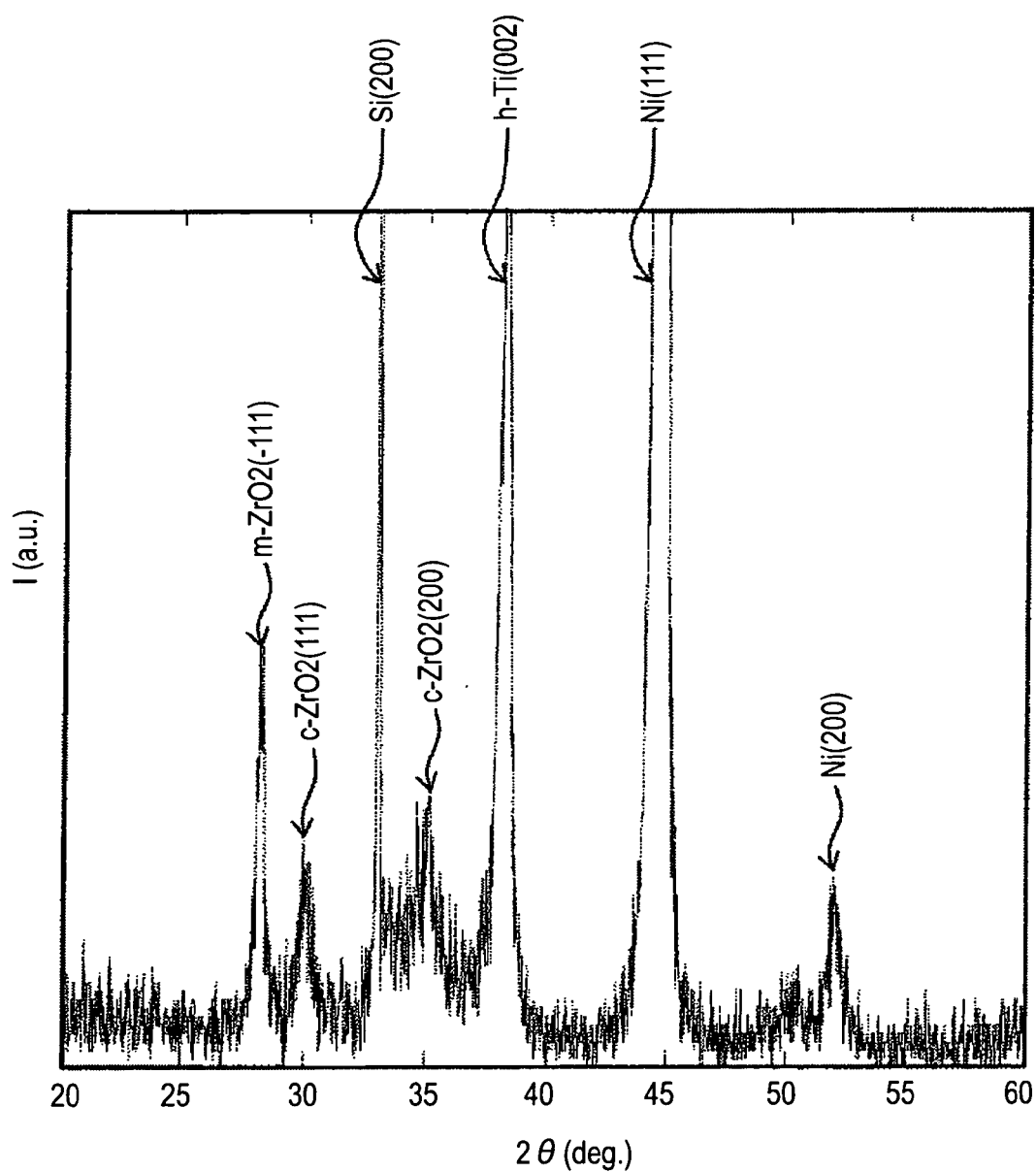
FIG. 11 is a graph representing the result of XRD structure analysis according to Fifth Example.

FIG. 11 presents the result of XRD structure analysis. In the facing targets sputtering performed under the foregoing conditions, a monoclinic crystal peak (m-$ZrO_2$) and a cubic crystal peak (c-$ZrO_2$) were detected. It can be seen from this that the capacitor dielectric film 12 obtained under the foregoing sputtering conditions has a crystalline structure.

By comparing FIG. 11 with FIG. 10 that presents the result of Fourth Example in which the substrate is not heated, it can be seen that the substrate heating increases both the monoclinic crystal peak (m-$ZrO_2$) and the cubic crystal peak (c-$ZrO_2$).

The substrate temperature measured as in First Example using a thermo label under the deposition conditions of this Example was 150° C. or less. The result shows that the temperature increase due to factors other than substrate heating, such as the adhesion of high-energy particles, is small.

The measured relative permittivity of the capacitor dielectric film 12 formed in Fifth Example was about 30, an increase from the relative permittivity (about 27) of the capacitor dielectric film 12 of Fourth Example due to the higher peaks.

8. Discussion of the Results of Fourth and Fifth Examples, and Comparative Example The foregoing Fourth and Fifth Examples revealed that adding heat energy to the printed-circuit board 1 during the deposition of the capacitor dielectric film 12 under the foregoing sputtering conditions promotes crystallization and improves relative permittivity.

For comparison, a sample including the capacitor dielectric film 12 deposited at room temperature in Fourth Example was subjected to a heat treatment (annealing) at 200° C.

Figure 12:
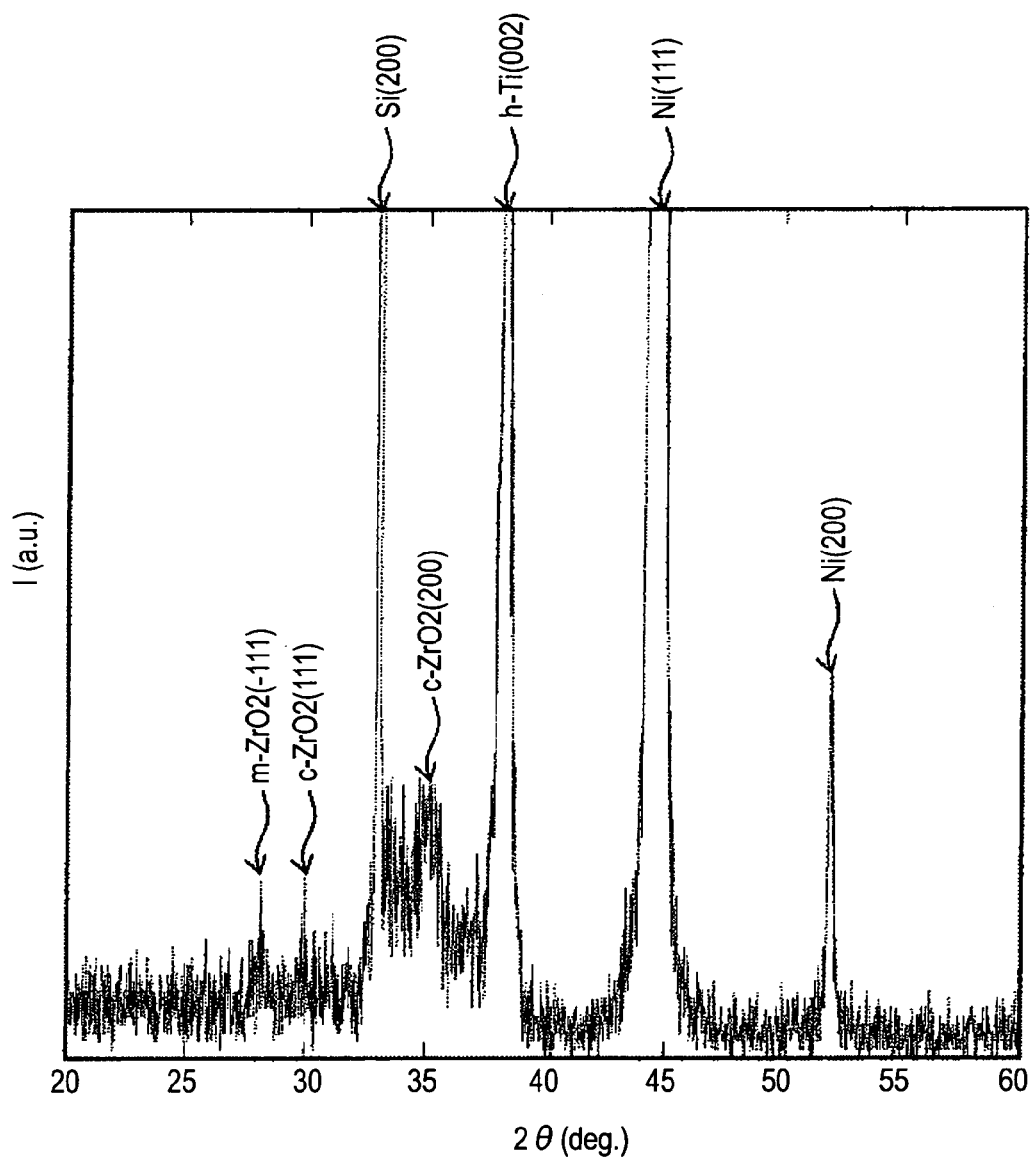
FIG. 12 is a graph representing the result of XRD structure analysis according Comparative Example of Fourth Example.

FIG. 12 presents the result of the XRD structure analysis of the annealed sample. By comparing FIG. 12 and FIG. 10, there is no large difference in the monoclinic crystal peak (m-$ZrO_2$) and the cubic crystal peak (c-$ZrO_2$), meaning that the annealing has almost no effect on $ZrO_2$ crystallization.

The result therefore shows that crystallization proceeds during the deposition in the technique that forms the crystalline metal oxide capacitor dielectric film 12 of the present embodiment. Substrate heating may be desirable in promoting crystallization of the capacitor dielectric film 12 and increasing relative permittivity. However, a sufficiently high relative permittivity is also obtainable without substrate heating. For the deposition of the capacitor dielectric film 12 by facing targets sputtering, the deposition temperature may be set to a temperature at or below the heat-resistant temperature of the lower substrate resin layer corresponding to the substrate resin layer 3, and at or above room temperature.

Using Pt for the base conductive layer in Fourth and Fifth Examples yielded the same XRD analysis result as that obtained when Ni was used for the base conductive layer. Further, relative permittivity was about the same.

The fact that annealing does not alter the properties means that high heat stability and a desired capacitor value (capacitance) are readily obtainable.

In the facing targets sputtering technique performed under the various conditions as in First to Fifth Examples, the substrate temperature during the deposition was 100° C. or less in the absence of substrate heating, or substrate heating was carried out at 100° C. In either case, the measured substrate temperature was 150° C. or less, a temperature sufficiently lower than the heat-resistant temperature of the currently available substrate resin layers.

When heating the substrate, it is desirable to control the applied heat energy to the high-energy sputtered metal oxide particles so that the actual temperature of the printed-circuit board 1 does not become higher than the heat-resistant temperature of the substrate resin layer 3 even in the presence of the applied heat energy.

According to the present embodiment, the thin-film capacitor including a crystalline metal oxide dielectric film can be formed at low temperatures within the printed-circuit board 1, using, for example, facing targets sputtering. The capacitor dielectric that contains crystalline metal oxide can have capacitor properties thermally more stable than amorphous dielectric films. Although the metal oxide particles have high energy, the plasma does not cause serious damage, because the printed-circuit board 1 is not exposed to the plasma.

Further, selection of a crystal structure and adjustment of relative permittivity are possible by appropriately selecting the lower electrode material according to the crystalline metal oxide dielectric material.

The deposition step is simpler than that of the sol-gel method.

Although the present embodiment is primarily based on the facing targets system, a sample may be bombarded with primarily high-energy sputtered particles also in the ECR system, provided that the sample is not in direct contact with the plasma. Thus, the low plasma-damaging crystalline metal oxide dielectric film also can be formed on the printed-circuit board 1 using ECR or ion-beam sputtering.

Because of the low plasma-damaging crystalline metal oxide dielectric film formed by facing targets, ECR, or EB sputtering in the present embodiment, electrostatic breakdown can be effectively avoided particularly in capacitor structures that include a laminated dielectric thin film or the like.

The present application contains subject matter related to those disclosed in Japanese Priority Patent Applications JP 2009-259811 and JP 2010-161864 filed in the Japan Patent Office on Nov. 13, 2009 and Jul. 16, 2010, respectively, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method for manufacturing a printed-circuit board, the method comprising:
a capacitive element forming step of embedding a capacitive element in a substrate resin layer inside a substrate that includes a plurality of wiring layers laminated with the substrate resin layer interposed in between,
the capacitive element forming step including
forming a lower electrode on a conductive layer of one of the plurality of wiring layers, or on one of the plurality of wiring layers;
forming a crystalline metal oxide-containing capacitor dielectric film on the lower electrode at a temperature at or below a heat-resistant temperature of the substrate resin layer, and at or above room temperature; and
forming an upper electrode on an upper surface of the capacitor dielectric film on a side opposite to the lower electrode,
wherein a lower surface of the crystalline metal oxide-containing capacitor dielectric film is in facial contact with the lower electrode and the upper surface of the crystalline metal oxide-containing capacitor dielectric film is in facial contact with the upper electrode.

2. The method according to claim 1, wherein the crystalline metal oxide film is formed by sputtering.

3. The method according to claim 2, wherein the crystalline metal oxide film is deposited on a printed-circuit board disposed outside of a plasma inside a facing targets, ECR, or ion beam sputtering apparatus.

4. The method according to claim 3, wherein the crystalline metal oxide of the capacitor dielectric film is formed from high-energy sputtered metal oxide particles that jump out of the plasma and reach the printed-circuit board.

5. The method according to claim 4, wherein the crystalline metal oxide of the capacitor dielectric film is formed by applying to the high-energy sputtered metal oxide particles that jump out of the plasma and reach the printed-circuit board a heat energy that brings the printed-circuit board to a temperature at or below the heat-resistant temperature.

6. The method according to any one of claims 1 to 5, wherein the capacitor dielectric film is formed to include an amorphous metal oxide first layer in contact with the lower electrode, a crystalline metal oxide second layer formed on the first layer, and an amorphous metal oxide third layer formed on the second layer and in contact with the upper electrode on the upper side,
the first layer, the second layer, and the third layer being continuously formed using the same metallic material.

7. The method according to claim 1, wherein the conductive material of the lower electrode in a portion directly in contact with the capacitor dielectric film is nickel (Ni), copper (Cu), or platinum (Pt).

8. A printed-circuit board, comprising:
a capacitive element embedded in a substrate resin layer inside a substrate that includes a plurality of wiring layers laminated with the substrate resin layer interposed in between,
the capacitive element including
a lower electrode formed on a conductive layer of one of the plurality of wiring layers, or on one of the plurality of wiring layers;
a dielectric film laminated on the lower electrode; and
an upper electrode laminated on the dielectric film,
wherein the dielectric film contains crystalline metal oxide,
wherein a lower surface of the capacitor dielectric film is in facial contact with the lower electrode and an upper surface of the capacitor dielectric film is in facial contact with the upper electrode and wherein the capacitor dielectric film includes a first layer fabricated from an amorphous metal oxide and in facial contact with the lower electrode;

a second layer fabricated from a crystalline metal oxide and formed on the first layer; and a third layer fabricated an amorphous metal oxide and formed on the second layer and in facial contact with the upper electrode, the first layer, the second layer, and the third layer being oxide layers of the same metallic material.

9. The printed-circuit board according to claim 8, wherein the conductive material of the lower electrode in a portion directly in contact with the capacitor dielectric film is nickel (Ni), copper (Cu), or platinum (Pt).

10. A printed-circuit board, comprising:
a base substrate having a top base substrate surface;
a first wiring layer;
a second wiring layer electrically isolated from the first wiring layer;
a substrate resin layer disposed on the top base substrate surface; and
a capacitive element embedded in the substrate resin layer and including:
a lower electrode formed on the top base substrate surface;
a capacitor dielectric film formed on the lower electrode; and
an upper electrode formed on an upper surface of the capacitor dielectric film, wherein the first wiring layer is disposed on a top surface of the substrate resin layer and in electrical communication with the upper electrode and the second wiring layer is in electrical communication with the lower electrode and wherein the capacitor dielectric film includes a first layer fabricated from an amorphous metal oxide and in facial contact with the lower electrode;

a second layer fabricated from a crystalline metal oxide and formed on the first layer; and a third layer fabricated an amorphous metal oxide and formed on the second layer and in facial contact with the upper electrode, the first layer, the second layer, and the third layer being oxide layers of the same metallic material.

11. The printed-circuit board according to claim 10, wherein the second wiring layer is disposed on the top surface of the substrate resin layer and juxtaposed the first wiring layer.

* * * * *